United States Patent [19]

Fontan et al.

[11] Patent Number: 4,812,949
[45] Date of Patent: Mar. 14, 1989

[54] METHOD OF AND APPARATUS FOR MOUNTING AN IC CHIP

[75] Inventors: Jacques Fontan, Sonchamp; Karel Kurzweil, Saint Nom La Breteche; Gérard Dehaine, Chatillon, all of France

[73] Assignee: Bull, S.A., Paris, France

[21] Appl. No.: 29,546

[22] Filed: Mar. 24, 1987

[30] Foreign Application Priority Data

Mar. 28, 1986 [FR] France ............................ 86 04500

[51] Int. Cl.⁴ .............................................. H05K 7/20
[52] U.S. Cl. ....................................... 361/386; 29/832; 357/80
[58] Field of Search ................... 29/832, 835, 837–840, 29/844, 845, 854; 165/80.3, 185; 174/16 HS; 357/80, 81; 361/386–389

[56] References Cited

U.S. PATENT DOCUMENTS

| | | | |
|---|---|---|---|
| 3,696,323 | 10/1972 | Kincaid | 339/192 R |
| 4,393,581 | 7/1983 | Cherian | 29/827 |
| 4,396,935 | 8/1983 | Schuck | 357/74 |
| 4,597,617 | 7/1986 | Enochs | 339/17 CF |

FOREIGN PATENT DOCUMENTS

| | | |
|---|---|---|
| 0081419 | 5/1985 | European Pat. Off. . |
| 0148083 | 7/1985 | European Pat. Off. . |
| 0166634 | 1/1986 | European Pat. Off. . |
| 2456390 | 12/1980 | France . |
| 2489592 | 3/1982 | France . |
| 1374666 | 11/1974 | United Kingdom . |

OTHER PUBLICATIONS

Larned et al., "IC Package Assemblies", IBM Technical Disclosure Bulletin, vol. 21, No. 5, 10/85, pp. 1517–1518.
Ehert et al., "Multichip Packaging", IBM Technical Disclosure Bulletin, vol. 14, No. 10, 3/72, p. 1.
Kilbain et al., "Printed Circuit Module Assembly", IBM Technical Disclosure Bulletin, vol. 25, No. 4, 9/82, p. 1803.

*Primary Examiner*—A. D. Pellinen
*Assistant Examiner*—G. Thompson
*Attorney, Agent, or Firm*—Kerkam, Stowell, Kondracki & Clarke

[57] ABSTRACT

A method for mounting an integrated circuit or chip (10) on a printed circuit board (11), the chip package (36) produced thereby, and a tape carrying chips for using the method are proposed. The chip is mounted by fixing its leads (12) on the zones (13) of the board (11) by securing the chip between a support board (15) and a heat dissipating element (14) that are connected with one another by conductive columns (16) to form the package (36). The invention is applicable in particular to manufacture of very large scale integration (VSLI) chips.

43 Claims, 3 Drawing Sheets

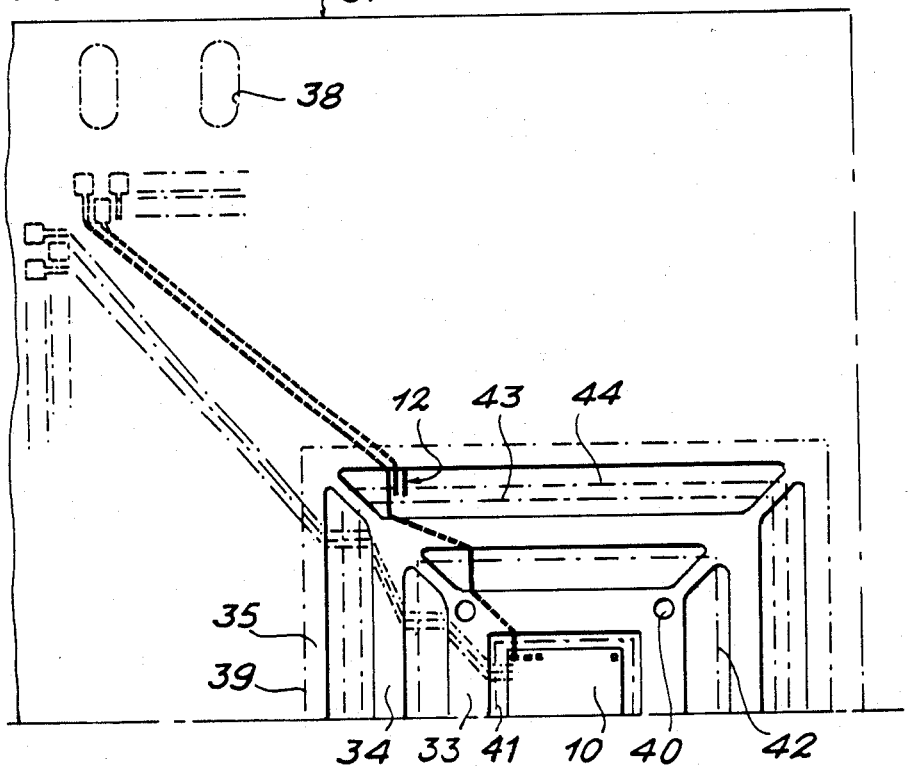
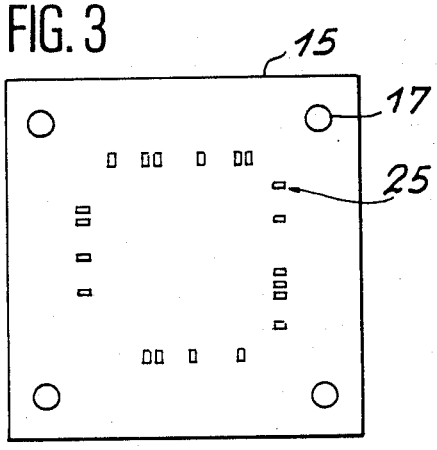
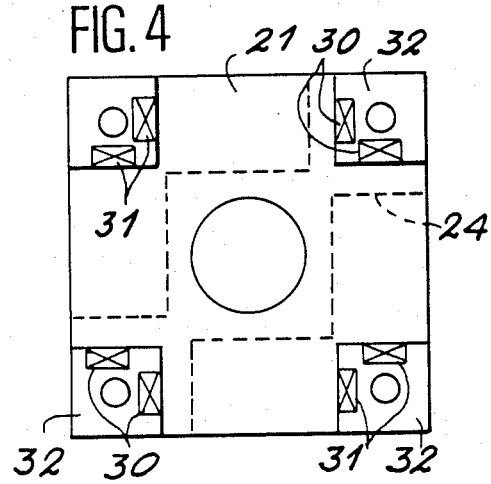

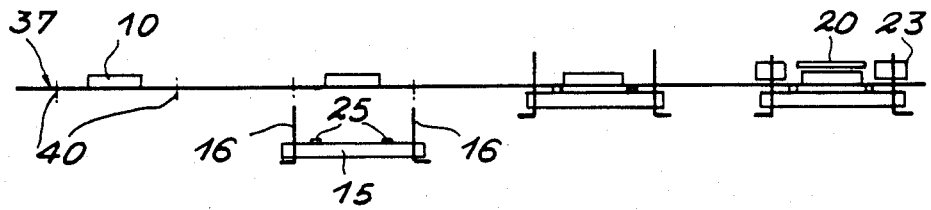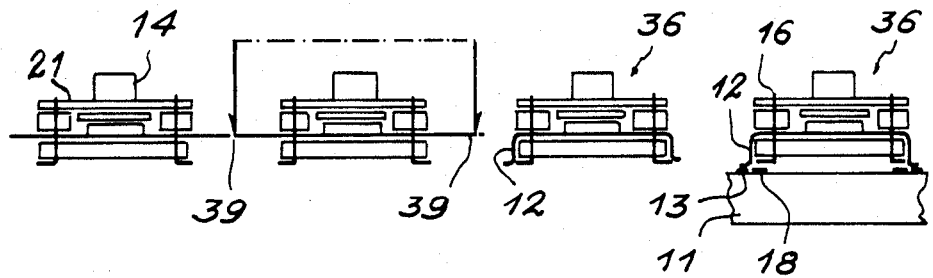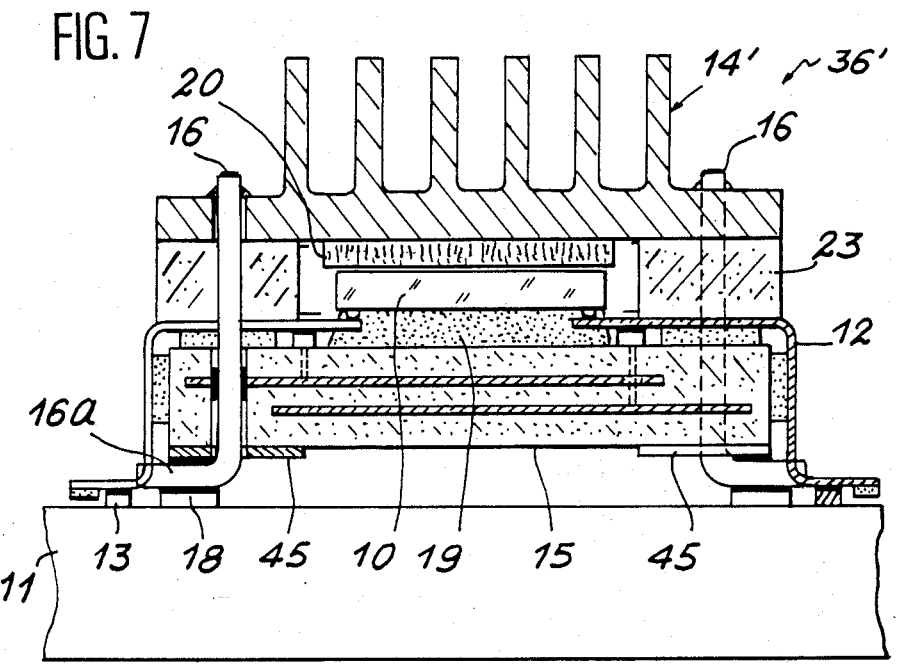

METHOD OF AND APPARATUS FOR MOUNTING AN IC CHIP

FIELD OF THE INVENTION

The invention relates to a method for mounting an integrated circuit on a printed circuit board, the resultant circuit package produced by using the method, and the tape carrying integrated circuits for use with performing the method.

BACKGROUND OF THE INVENTION

The invention relates to integrated circuits and more particularly to integrated circuits of the very large scale integration (VSLI) type. Integrated circuits are also known as chips. At present, VLSI chips are small, substantially square semiconductor plates, measuring about one centimeter on a side and having a thickness of less than one millimeter. The active face of a chip incorporates the circuits which are integrated in the small plate and carry the input/output pads. The opposite face of a chip is called the chip back. Because of the very large scale integration, the active face ordinarily contains on the order of 500 pads, and is subject in operation to a high heat density which must be dissipated. For example, a VSLI chip of the N-MOS type (that is, field-effect transistors of the metal-oxide- semiconductor type, or FET-MOS) can dissipate on the order of four watts.

Generally, several chips are interconnected by mounting them on a printed circuit board. Mounting is performed by two well known methods. The most current method comprises encapsulating each chip in a package and soldering the terminals of the package on the corresponding zones on a printed circuit board. The packages afford good mechanical protection and are easily assembled on a board, but they have the disadvantage of being very bulky, and the number of them that can be accommodated on a board is limited. The second method overcomes this disadvantage by connecting each chip directly to the board. This technique is currently known as "micropackaging".

To facilitate handling of bare chips before they are mounted on a card or board, a method presently known as tape-automated bonding (TAB) comprises disposing the integrated circuits on a flexible carrier tape known as TAB tape. Each chip is provided with leads adapted to be supported on the edges of a window formed into the tape. The leads of each chip are cut off on the inside of the window to separate the chip from the tape and the leads are then soldered to corresponding zones of a printed circuit board in an output lead bonding (OLB) operation.

In a standard manner, the backs of the chips rest on the printed circuit board, and their leads which are pre-bent come into contact with contact zones of the board, to which they are soldered using an OLB soldering tool. In this case, the heat generated is dissipated via the board.

In another mode of manufacture, called reverse TAB or FLIP-TAB, the tape is presented so that the active faces of the chips are located facing the board. The leads of the chips are soldered to the zones on the card or board without being bent beforehand. A heat dissipating element is applied to the back of each chip.

The standard package for a VLSI chip is a pin-grid array package. In this package, the back of the chip rests on the bottom of a cavity made on one face of a multilayer integrated circuit board and surrounded by several rows of pins at right angles to the board. The edges of the cavity are arranged in steps, provided with zones for connection to the corresponding pads of the chip. This connection is done by wire bonding. The chip back is in contact with a heat dissipating element that emerges from the other face of the board so that it can be connected to a cooling device such as a heat sink. Mounting of the package on a board is preferably done by a zero insertion force (ZIF) connector. The pins are introduced into the connector without force, and are then secured in the contact elements of the connector.

In practice, the method of mounting a chip on a board via a pin-grid array package has many disadvantages. The printed circuit board is a complex, costly element, and highly susceptible to defects. The conductor elements of printed circuits are arranged on several planes, for example six, that are interconnected between adjacent planes by vias. These conductor elements are quite narrow, to accommodate the high density required by the great number of pads of the chip. The relative disposition of these elements and the corresponding vias must accordingly be very precise, to assure correct bonding at all points. In practice, this condition is difficult to meet, and it increases the cost of a board. Moreover, connecting the pads of the chip to the zones of the package cavity is presently done by soldering very thin wires, typically of gold or aluminum. Taking into account the high density of the pads and the distribution of the zones in steps, the automation of wire bonding is complicated and delicate.

Briefly, bonding of a pad of a chip to a corresponding pin of the package typically involves twice soldering the wire connecting the pad to the corresponding zone of the package; thin, narrow conductors realized as printed circuits in the multilayer board; vias for interconnecting the conductor elements; and finally, soldering the last conductor element to the pin. The package equipped with the chip thus contains a high number of connection points, which affects the dependability of the overall package and increases its cost. Finally, the package is mounted on a ZIF connector of a printed circuit board. This connector has the advantage of being dependable and of furnishing an easily moved connection, but it has the disadvantage of being bulky and expensive.

Using the TAB technique for making a package has already been proposed in French Patent No. 2 456 390. This patent exploits the essential feature of TAB, which is to have each chip provided with its set of leads supported by a tape. According to this patent, the cut-off ends of the leads of a TAB tape comprise the output terminals of a package that is formed simply by sheathing the chip and the adjacent portions of its leads in an electrical insulation resin. The resin also keeps in place a heat dissipating element applied to the chip back. Each lead is of only slight thickness in the vicinity of the chip, and its thickness is great beyond the chip. The slight thickness lends the leads the requisite flexibility for uniform and reliable soldering of all the leads to the pads of the chip, while the great thickness of the leads notably increases the rigidity of the resin of the package and furnishes the desired rigidity for the output terminals of the package.

This TAB package is suitable only for chips having a low number of leads. In fact, the package is not rigid unless the leads themselves are rigid. Yet rigidity is an essential condition for a package, to avoid any breakage or damage of the chip or one of its leads. The package must be all the more rigid, the greater the surface area of the chip. Increasing the rigidity of the resin cannot be attained without increasing the cross section of the leads. This is possible only with a low density of the leads. Accordingly, this package is not suitable for VLSI chips.

OBJECT AND SUMMARY OF THE INVENTION

With the provisions of the present invention, the TAB method can be used for mounting a chip on a board, and it is possible to manufacture a package that is adapted to VLSI chips having high density pads.

The method according to the invention for mounting an integrated circuit, or chip, on a printed circuit board, comprising disposing the active face of the chip facing the board, soldering the ends of the leads of the chip to the corresponding zones of the board, and applying a heat dissipating element to the back of the chip is characterized in that it comprises, prior to the soldering step of disposing a rigid support, provided with at least one conductor element, between the board and the portion of the leads adjacent to the chip, and bending the leads on the edge of the support in order to place the ends of the leads at the level of the zones of the board, and furthermore comprises soldering the conductor element to a corresponding zone of the board and connecting the heat dissipating element to the support and to the conductor element.

In corollary fashion, the package according to the invention for a very large scale integration chip, the back of which is connected to a heat dissipating element and the leads of which have free end portions comprising the output terminals of the package and inner portions affixed via an insulating support, is characterized in that the support is a rigid board disposed facing the active face of the chip, fixed to the heat dissipating element via an electrically insulating bracing frame surrounding the chip, and provided with at least one conductor element connected to the heat dissipating element.

The characteristics and advantages of the invention will become apparent from the ensuing detailed description of an exemplary embodiment, taken in conjunction with the drawings.

BRIEF DESCRIPTION OF THE DRAWINGS

FIG. 3 is a plan view of the support of the package shown in FIG. 1;

FIG. 4 is a plan view of the cap of the package shown in FIG. 1;

FIG. 5 is a fragmentary plan view of a tape carrying integrated circuits, for performing the method according to the invention;

FIGS. 6A–6H schematically illustrate the steps in the method according to the invention for mounting a chip of FIG. 1 of the support shown in FIG. 3 on a printed-circuit board; and FIG. 7, in similar to that of FIG. 1, shows a variant embodiment the method and package according to the invention and is also shown in a slightly exploded view.

DESCRIPTION OF THE PREFERRED EMBODIMENT

Figure 1:
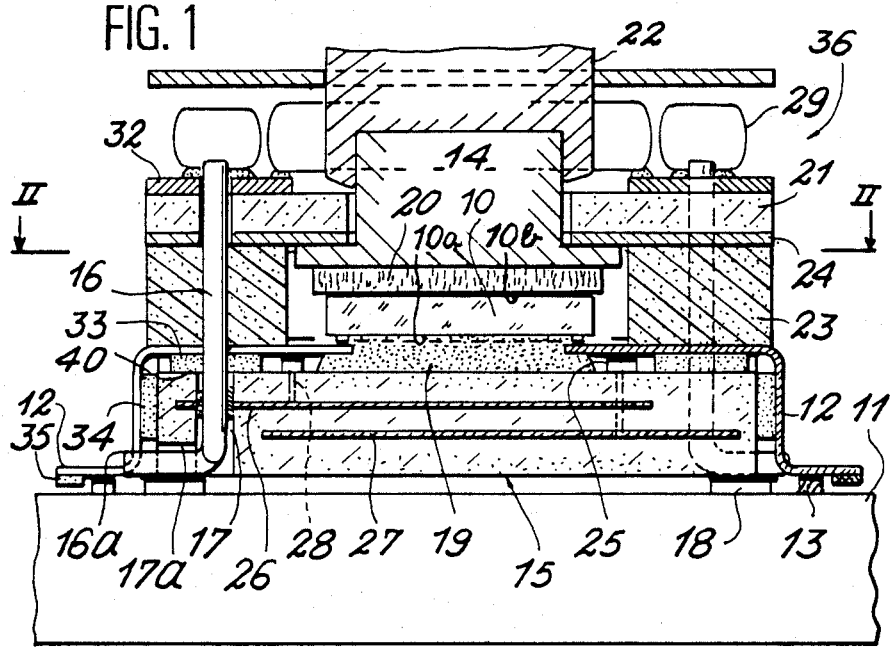
FIG. 1 is view taken along the line I—I of FIG. 2, showing an integrated circuit, or chip, mounted by the method according to the invention on a printed circuit board by means of a package according to the invention and is shown in a slightly exploded view for easier differentiation of the elements.
Figure 2:
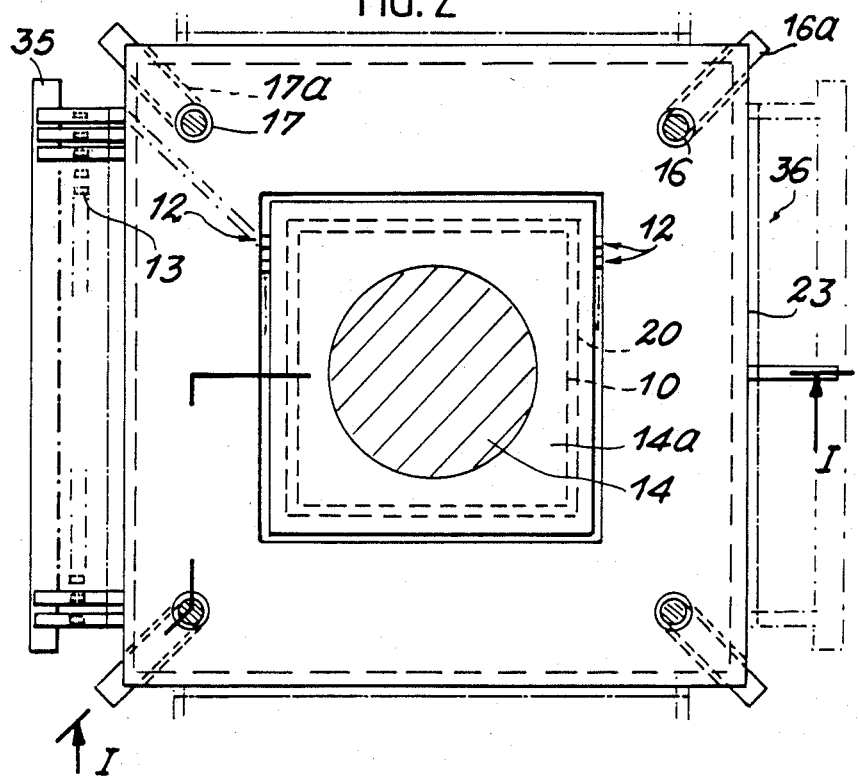
FIG. 2 is a plan view along the line II—II of the package shown in FIG. 1.

FIGS. 1 and 2 show an example according to the invention of mounting an integrated circuit or chip 10 on a printed circuit board 11. The chip 10 is of the type having an active face 10a provided with input/output pads on the edge, connected to leads 12 arranged in a radiating pattern, and a rear or back face 10b. For better illustration of the characteristics of the invention, it is assumed for example that the chip 10 is a VLSI chip of the MOS type, measuring one centimeter on a side and provided with ten leads 12 per side. It is also assumed that the supply of electricity to the chip requires two voltage levels V1, V2 and that the back 10b of the chip 10 must be connected to the voltage V1, for example, ground. Moreover, the board 11 is provided with zones 13 for mounting the chip 10. The mounting method is of the FLIP-TAB type, comprising the steps of disposing the active face 10a of the chip 10 facing the board 11, soldering the ends of the leads 12 of the chip to the corresponding zones 13 of the board, and applying a heat dissipating element 14 to the back 10b of the chip 10. According to the invention, the method comprises, prior to the soldering step, the steps of disposing a support 15, which is provided with at least one conductor element 16, between the board 11 and the chip 10 associated with an adjacent portion of its leads 12, and bending the leads 12 at the edge of the support in order to place the ends of the leads at the level of the corresponding zones 13 of the board 11. In the example shown, the support 15 is a rigid plate or board provided with four conductor elements 16, in the form of rigid conductive columns. The columns 16 pass through the support 15 in holes 17 made in the four corners of the support at right angles to its two large faces. Each column 16 is orthogonally bent, to have a base 16a the lower face of which is substantially coplanar with the lower faces of the ends of the leads 12. A similar bending 17a of the holes 17 in the lower portion of the support 15 determines the positioning of the columns with respect to the support. According to the invention, the board 11 is provided with four terminals 18 for the fixation of the bases 16a of the columns 16. In the example shown, the four terminals 18 are advantageously coupled with sources of voltage V1, V2 in such a manner that two adjacent terminals receive different voltages.

The active face of the chip is fixed to the support 15 via a layer of glue 19. The chip 10 can accordingly receive the heat dissipating element 14 without being damaged. The element 14, such as that shown in the form of a rivet having a square head 14a, has approximately the same dimensions as the chip 10 so it can be connected to the chip via a flexible interface element 20. The element 20 may for example be a foam filled with flakes, the flakes being of such a kind, and arranged such, as to lend the foam good thermal conduction. Maintenance of the coupling between the element 14 and the chip 10 is assured by means of a plate that forms a cap or lid 21 fixed to the columns 16 and through which the cylindrical body of the element 14 passes. The element 14 can thus be coupled to a cooling device, such as a heat sink 22. The heat sink 22 shown is in the form of a solid via that is a good thermal conductor, mounted by being plugged to the cylindrical body of the element 14 and provided with transverse fins. The distance between the cap 21 and the support 15 is determined by the bracing elements 23 placed on the leads 12 of the chip 10. The bracing elements 23 shown are assembled in the form of a frame surrounding the chip 10, the frame being mounted on the columns 16 and then glued to the cap 21. Alternatively, the frame could be integral with the cap. Generally, the heat dissipating element 14 should be connected to the electrical ground of the board 11, conventially the voltage V1. The invention offers the advantage of making this connection via at least one of the conductor elements 16 which is connected to the terminal 18 representing the voltage V1. In the example shown, the element 14 is advantageously connected to the two columns 16 that are connected to the terminals representing the voltage V1, via a conductive foil 24 carried on the lower face of the cap 21. The conductive foil 24 has a ring that comes into contact with the portion 14a of the element 14 and is extended to surround the two columns 16, so that the foil 24 can be connected to these columns by soldering. Soldering thus takes the place of mechanical fixation of the cap 21. In the present case, where the back 10b of the chip 10 must be connected to ground, it is then sufficient for the thermal interface element 20 to be a good electrical conductor as well.

As shown in FIG. 3, The support 15 has on its upper face the conductor blocks 25 located near the chip 10, corresponding with predetermined leads 12. The support 15 is generally a printed circuit board intended for connection of the blocks 25 with at least one of the sources of voltage V1, V2 via at least one of the conductor elements 16 and the corresponding terminals 18 of the board 11. In the example shown in FIG. 1, the support 15 includes two printed circuit conductor sheets 26, 27 arranged to be connected respectively to the columns 16 representing the voltages V1, V2. In the example shown, the connection of the sheets 26, 27 to the corresponding columns 16 is done by soldering extensions of the sheets 26, 27 around holes 17 that receive the columns 16. Connections 28 connect the planes 26, 27 to the respective blocks 25, for example by the technique of metallized holes. The supply of voltage V1, V2 to the chip 10 is then done near the chip, from the blocks 25 to the terminals 18. This path short-circuits the corresponding leads 12 and consequently has a more greatly attenuated self-induction component. The example shown has the further advantage that decoupling via capacitors 29 at the level of the columns 16 is possible. As shown in FIG. 4, the upper face of the cap 21 is provided with four pairs of pads 30, 31, each being intended for fixation of one capacitor 29 by soldering. The eight pads comprise two adjacent sides of four small conductor plates 32 located in the four corners of the cap 21, surrounding the columns 16 and soldered to them. The pads 30 thus receive the voltage V1, and the pads 31 receive the voltage V2.

Taking into account the presumed very high density of the leads 12 of the chip 10, their very slight thickness and width makes them very flexible and very fragile. To facilitate bending and soldering them while avoiding their deformation and short-circuiting among them, they are preferably kept in position by being fixed, for example by gluing, to flexible, electrically insulating support frames. In the example shown, an inner frame 33 is arranged for placement on the support 15 between the blocks 25 and the edges of the support. An intermediate frame 34 is placed on the sides of the support 15, and an outer frame 35 fixes the ends of the leads 12 beyond the zones 13. The overall arrangement shown in FIG. 2 and soldered to the board 11 in the manner shown in FIG. 1 comprises a package 36 for the chip 10.

The configuration of the chip 10, its leads 12 and the frames 33-36 is well matched to the TAB method. FIG. 5 shows a plan view of part of a TAB tape 37 relating to a single chip 10, intended for being mounted in the package 36 shown in FIGS. 1 and 2. In the interest of symmetry, FIG. 5 shows only one-half of the tape 37 with respect to its longitudinal center line. In the standard manner, the TAB tape 37 is provided with lateral perforations 38 to enable it to be precisely positioned. The leads 12 of the chip 10 are initially supported on the frame 33, then on the frame 34, and finally they spread over the tape 37 to the vicinity of the perforations 38. The frame 35 is formed by cutting off the tape 37 along the line 39 as shown by a dot-dash line in the drawing. Holes 40, also referred to as reference points 40, are made at the four corners of the frame 33 for the passage of the columns 16, for precise positioning of the chip 10 and its leads 12 precisely with respect to the columns 16. The line 41 along which the blocks 25 are aligned and soldered to the leads 12, the lines 42 and 43 along which the leads 12 are bent on the lateral walls of the support 15 so as to be at the level of the zones 13 of the board 11, and the line 44 along which the leads 12 are soldered to the zones 13 are shown in FIG. 5 as dot-dash lines.

FIGS. 6A-6H schematically illustrate the steps in a method according to the invention for mounting the integrated circuit or chip 10, as shown in FIG. 1, of the tape 37 on the printed circuit board 11. FIG. 6A corresponds to the tape 37 as shown in FIG. 5. In FIG. 6B, the support 15 provided with four columns 16 is located beneath the tape 37. The holes 40 in the tape 37 and the columns 16 of the support 15 serve as reference points for positioning the support with respect to the tape. In FIG. 6C, the support 16 is fixed on the tape by means of the correspondence of the columns 16 with the holes 40 in the tape 37 and by soldering of the blocks 25 to the corresponding leads 12 of the chip 10. In FIG. 6D, the bracing element 23 is plugged into the columns 16 and optionally glued to the leads 12, for example via an adhesive membrane. The thermal interface element 20 is positioned on the back 10b of the chip 10. In FIG. 6E, the cap 21 provided with the heat dissipating element 14 and decoupling capacitors 29 is plugged into the columns 16 and fixed to them, for example by means of a conductive glue or by soldering. In FIG. 6F, the tape 37 is cut off along the line 39, to separate the chip 10 from the tape. In FIG. 6G, the leads 12 are bent along the lines 42 or 43 of FIG. 5. The result is the package 36. In FIG. 6H, the package 36 is mounted on the board 11 by soldering the ends of the leads 12 to the zones 13 of the board 11. The soldering is advantageously done by the OLB method mentioned above.

FIG. 7, in a view similar to that of FIG. 1, shows a variant embodiment of the method according to the invention and of the resultant package 36. In this package, elements similar to those of the package 36 are identified by the same reference numerals. A first difference is in the fact that the heat dissipating element 14' in the package 36' is a heat sink used in place of the heat sink 22, the heat dissipating element 14, the cap 21 and the conductive foil 24 in the package 36 of FIG. 1. The heat sink 14' is mechanically and electrically connected to the two columns 16 representing the voltage V1, but optionally it may be connected solely mechanically to two other columns. A second difference in the variant according to FIG. 7 is in the positioning of the columns 16 on the support 15. The bases 16a here are fixed, for example by soldering, to metal pieces 45 affixed to four lower corners of the support.

What is claimed is:

1. A method for mounting an integrated circuit or chip (10) on a printed circuit board (11) having zones via an interface element (20); the chip including leads connected to the chip, comprising:
   (a) disposing the active face (10a) of the chip facing the board;
   (b) connecting a heat dissipating elements (14) to the back (10b) of the chip via an interface element (20);
   (c) disposing a rigid support (15), provided with at least one conductor element (16), between the board and the portion of the leads adjacent to the chip;
   (d) bending the leads (12) adjacent the edge of the support in order to place the ends of the leads at the level of the zones of the board;
   (e) soldering the conductor element (16) to a corresponding terminal (18) of the board;
   (f) electrically connecting the heat dissipating element (14) to the support and to at least one conductor element ;and
   (g) soldering the ends of the leads (12) connected to the chip at corresponding zones (13) of the boards.

2. A method as defined by claim i, wherein the leads (12) connected to the chip (10) are soldered on blocks (25) disposed on the support (5), each of said blocks being connected respectively to at least one conductor element (16) of the support.

3. A method as defined by claim 1 or 2, further comprising disposing over the support (15) a cap (21) provided with pairs of pads (30,31) each adapted for fixation of one decoupling capacitor (29) and for respectively connecting the pads of each pair to each of at least one conductor element (16) of the support.

4. A method as defined by claim 3, further comprising disposing between the cap and the support, bracing insulating elements (23) located on the leads connected to the chip and for mechanical fixation of the cap on the conductor elements.

5. A method as defined by claim 3, further comprising thermally connected the heat dissipating element (14) on the cap.

6. A method as defined by claim 4, further comprising thermally connected the heat dissipating element (14) on the cap.

7. A method as defined by claim 1 further comprising disposing a flexible interface element (20) which is a good thermal conductor between the heat dissipating element (14) and the back (10b) of the chip (10).

8. A method as defined by claim 5 further comprising disposing a flexible interface element (20) which is a good thermal conductor between the heat dissipating element (14) and the back (10b) of the chip (10).

9. A method as defined by claim 6 further comprising disposing a flexible interface element (20) which is a good thermal conductor between the heat dissipating element (14) and the back (10b) of the chip (10).

10. A method as defined by one of the claims 1-2, wherein the chip is initially mounted on a TAB tape (37), and further comprising the steps of disposing reference points (40) on the tape (37), making the reference points (40) correspond with the support points (16, 17) prior to the fixation of the support on the tape, and cutting off (along line 39) the portion of the tape (37) prior to the soldering.

11. A method as defined by claim 3 wherein the chip is initially mounted on a TAB tape (37), and further comprising the steps of disposing reference points (40) on the tape (37), making the reference points (40) correspond with the support points (16, 17) prior to the fixation of the support on the tape, and cutting off (along line 39) the portion of the tape (37) prior to the soldering.

12. A method as defined by claim 4 wherein the chip is initially mounted on a TAB tape (37), and further comprising the steps of disposing reference points (40) on the tape (37), making the reference points (40) correspond with the support points (16, 17) prior to the fixation of the support on the tape, and cutting off (along line 39) the portion of the tape (37) prior to the soldering.

13. A method as defined by claim 5 wherein the chip is initially mounted on a TAB tape (37), and further comprising the steps of disposing reference points (40) on the tape (37), making the reference points (40) correspond with the support points (16, 17) prior to the fixation of the support on the tape, and cutting off (along line 39) the portion of the tape (37) prior to the soldering.

14. A method as defined by claim 6 wherein the chip is initially mounted on a TAB tape (37), and further comprising the steps of disposing reference points (40) on the tape (37), making the reference points (40) correspond with the support points (16, 17) prior to the fixation of the support on the tape, and cutting off (along line 39) the portion of the tape (37) prior to the soldering.

15. A method as defined by claim 7 wherein the chip is initially mounted on a TAB tape (37), and further comprising the steps of disposing reference points (40) on the tape (37), making the reference points (40) correspond with the support points (16, 17) prior to the fixation of the support on the tape, and cutting off (along line 39) the portion of the tape (37) prior to the soldering.

16. A method as defined by claim 8 wherein the chip is initially mounted on a TAB tape (37), and further comprising the steps of disposing reference points (40) on the tape (37), making the reference points (40) correspond with the support points (16, 17) prior to the fixation of the support on the tape, and cutting off (along line 39) the portion of the tape (37) prior to the soldering.

17. A method as defined by claim 9 wherein the chip is initially mounted on a TAB tape (37), and further comprising the steps of disposing reference points (40) on the tape (37), making the reference points (40) correspond with the support points (16, 17) prior to the fixation of the support on the tape, and cutting off (along line 39) the portion of the tape (37) prior to the soldering.

18. A method as defined by claim 10, wherein the conductor elements include rigid columns (16), and the points of correspondence of the support and the tape are holes (17, 40).

19. A package (36,36') for an integrated circuit chip (10) having an active face (10a) and a back face (10b) comprising:
   (a) a tape automated bonding pattern of electrical leads (12) for connection to the active face of the chip;

(b) a heat sink base (14) for connection to the back face of the chip;

(c) a rigid board (15) disposed facing the active face (10a) of the chip (10) said board supporting a portion of the pattern of leads and said board having at least two conductive planes (26,27) and a plurality of conductive areas respectively connected to one of the conductive planes and arranged to be in contact with a respective plurality of said leads in the vicinity of the chip; and (d) conductor elements (16) fixed perpendicular to the board, each having an outer end for application of an external supply potential and being electrically connected to at least one of the conductive planes.

20. A package as defined by claim 19, wherein the heat sink base (14) is attached and electrically connected to the board through at least two of the conductor elements.

21. A package as defined by claim 19 wherein the support (15) is attached to the heat sink base (14) through cap means (21).

22. A package as defined by claim 21, wherein the cap means (21) includes conductor means (24) effecting electrical connection of the heat sink base (14) with at least one conductor element (16) of the board (15).

23. A package as defined by claim 19, further comprising decoupling capacitance means electrically coupled to the conductive planes.

24. A package as defined by claim 23, wherein the heat sink base is attached to at least two conductor elements through cap means (21) having pads (30,31) respectively connected to the conductor elements and to one electrode of said capacitance means.

25. A package as defined by claim 19 or 20 wherein the conductor elements (16) are columns that pass through the board (15) in holes (17) and are provided with bent bases (16a) the lower face of which is substantially coplanar with the ends of the leads (12).

26. A package as defined by claim 19 wherein the TAB pattern of leads (12) are kept in position by at least one frame of electrically insulating material.

27. A package as defined by claim 26, wherein said one frame (35) fixes the free ends of the leads (12).

28. A package as desired by claim 26 wherein said one frame (33) includes holes (40) for positioning of the conductor elements (16) with respect to the chip (10).

29. A package as defined by claims 19 or 20 wherein a flexible interface element (20) which is a good thermal conductor is disposed between the back (10b) of the chip (10) and the heat dissipating element (14).

30. A package as defined by claim 19 further including a tape (37) for carrying chips (10), wherein the leads (12) carry the corresponding chip (10) via at least one frame has apertures (40) adapted to receive conductor column elements (16).

31. A package as defined in claim 21 wherein the cap means further comprises an electrically insulating bracing frame (23) surrounding the chip between the cap and the pattern of leads supported by the board.

32. A package as defined in claim 24, wherein the cap is substantially rectangular and the pads (30,31) are two adjacent sides of rectangular conductor plates (32) disposed at the respective corners of the cap, each pad being connected to one conductor element of the board, and said capacitance means comprises capacitors respectively fixed to two adjacent ones of said conductor plates.

33. A package as defined in claim 26, wherein a frame (33) includes means (40) cooperating with at least two of the conductor elements for positioning the pattern of leads with respect to said conductive areas (25) of the board.

34. A package as defined in claim 19, wherein the conductive planes are embedded in the board (15) and the conductive areas (25) are outer areas of vias (28) made through the board to connect one of the conductive planes.

35. A package for an integrated circuit chip (10) having an active face (10a) and a back face (10a), comprising a tape automated bonding pattern of leads (12) connected to the active face of the chip; a rigid board (15) disposed facing the active face of the chip, supporting a portion of the pattern of leads and said board having at least two conductive planes (26,27) and a plurality of conductive areas respectively connected to one of the conductive planes and arranged to be in contact with a respective plurality of said leads in the vicinity of the chip; conductive columns (16) fixed perpendicular to the board, each having an end for connection to an external supply potential and being electrically connected to at least one of the conductive planes; a heat sink base (14) connected to the back face of the chip via a thermal interface element (20); and cap means (21, 23) for attaching the heat sink base to at least two of said columns, said cap means being disposed on the pattern of leads and having means (24) for electrically connecting the heat sink base to at least one of the columns attached to the cap means.

36. A package as defined in claim 35, further comprising decoupling capacitance means (29) electrically coupled to the conductive planes.

37. A package as defined in claim 36, wherein the cap means comprises a cap (21) made of an electrically insulating material and having a face carrying pads (30,31) each connected to a column attached to the cap and to one electrode of said capacitance means.

38. A package as defined in claim 37, wherein the cap is apertured to fixedly accommodate the heat sink base and has an opposite face substantially covered with a conductive foil (24) for electrically connecting the heat sink base to at least one pad of the column.

39. A package as defined in claim 38, wherein the cap means further comprises an electrically insulating bracing frame (23) surrounding the chip between the cap and the pattern of leads supported by the board.

40. A package as defined in claim 37, wherein the cap means is substantially rectangular and the pads (30,31) are two adjacent sides of rectangular conductor plates (32) disposed at the respective corners of the cap, each pad being connected to one conductor element of the board, and said capacitance means comprises capacitors respectively fixed to two adjacent ones of said conductor plates.

41. A package as defined in claim 35, wherein said leads (12) of the TAB pattern are kept in position by at least one frame (33-35) of electrically insulating material.

42. A package as defined in claim 41, wherein a frame ? (33) includes means (40) cooperating with at least two of the columns for positioning the TAB pattern of leads with respect to said conductive areas (25) of the board.

43. A package as defined in claim 35, wherein the conductive planes are embedded in the board (15) and the conductive areas (25) are outer areas of vias (28) made through the board to connect to one of the conductive planes.

* * * * *

UNITED STATES PATENT AND TRADEMARK OFFICE
CERTIFICATE OF CORRECTION

PATENT NO. : 4,812,949

DATED : March 14, 1989

INVENTOR(S) : Jacques Fontan, et al

It is certified that error appears in the above-identified patent and that said Letters Patent is hereby corrected as shown below:

Column 7;

Claim 1, in formal text line 3, delete "via an interface element (20)".

Claim 2, line 1, delete "i" and substitute --1--.

Claim 2, line 3, delete "(5)" and substitute --(15)--.

Claim 5, line 2, delete "connected" and substitute --connecting--.

Claim 6, line 2, deleted "connected" and substitute --connecting--.

Column 9;

Claim 28, line 1, delete "desired" and substitute --defined--.

Claim 30, line 4, after "frame" insert --(33,34) on the tape and characterized in that said one frame--.

UNITED STATES PATENT AND TRADEMARK OFFICE
CERTIFICATE OF CORRECTION

PATENT NO. : 4,812,949

DATED : March 14, 1989

INVENTOR(S) : Jacques Fontan, et al

It is certified that error appears in the above-identified patent and that said Letters Patent is hereby corrected as shown below:

Column 10;

Claim 35, line 2, "(10a) second occurance should be --(10b)--.

Claim 35, line 3, after "comprising" insert --:--.

Signed and Sealed this

Tenth Day of November, 1992

*Attest:*

DOUGLAS B. COMER

*Attesting Officer*     Acting Commissioner of Patents and Trademarks